United States Patent [19]
Tooher

[11] Patent Number: 6,160,730
[45] Date of Patent: *Dec. 12, 2000

[54] MULTI-BLOCK MEMORY

[75] Inventor: Michael Tooher, Stoccarda, Germany

[73] Assignee: STMicroelectronics, S.r.l., Agrate Brianza, Italy

[*] Notice: This patent issued on a continued prosecution application filed under 37 CFR 1.53(d), and is subject to the twenty year patent term provisions of 35 U.S.C. 154(a)(2).

[21] Appl. No.: 08/833,900

[22] Filed: Apr. 10, 1997

[30] Foreign Application Priority Data

Nov. 4, 1996 [EP] European Pat. Off. .............. 96830204

[51] Int. Cl.[7] ..................................................... G11C 5/06
[52] U.S. Cl. ................................................ 365/63; 365/51
[58] Field of Search ................................. 365/230.06, 51, 365/63, 69

[56] References Cited

U.S. PATENT DOCUMENTS

| | | | |
|---|---|---|---|
| 4,977,542 | 12/1990 | Matsuda et al. ................... | 365/230.06 |
| 4,982,368 | 1/1991 | Arimoto .............................. | 365/230.06 |
| 5,276,650 | 1/1994 | Kubota ................................... | 365/207 |
| 5,379,246 | 1/1995 | Nogami ..................................... | 365/51 |
| 5,463,577 | 10/1995 | Oowaki et al. ........................... | 365/63 |
| 5,519,655 | 5/1996 | Greenberg ................................ | 365/63 |
| 5,619,447 | 4/1997 | Tai ............................................ | 365/63 |
| 5,708,620 | 1/1998 | Jeong .................................. | 365/230.06 |
| 5,784,311 | 7/1998 | Assaderaghi et al. ................... | 365/150 |
| 5,828,594 | 10/1998 | Fujii ......................................... | 365/63 |
| 5,978,247 | 11/1999 | Lee ........................................... | 365/63 |

*Primary Examiner*—Richard Elms
*Assistant Examiner*—Van Thu Nguyen
*Attorney, Agent, or Firm*—Theodore E. Galanthay; Robert Iannucci; Seed IP Law Group PLLC

[57] ABSTRACT

The invention relates to a memory comprising memory cells arranged in continuous rows which are divided in at least two subrows separately selectable by a row decoder through respective word selection metallizations. Each word selection metallization extends over the row containing the corresponding subrow and the subrows of each row are interlaced.

14 Claims, 3 Drawing Sheets

MULTI-BLOCK MEMORY

FIELD OF THE INVENTION

The present invention relates to a memory in which power consumption is reduced by splitting the matrix of memory cells into several blocks which are accessed individually.

DISCUSSION OF THE RELATED ART

FIG. 1 shows a conventional memory structure with a single matrix M of memory cells 10. Each row i (i=1, 2 ... n) of memory cells is selected for access by a row decoder 12 through a respective word line $WL_i$ ($WL_1$, $WL_2$ ... $WL_n$). The memory cells 10 of each column j (j=1, 2 ... m) are connected to a common bit line $BL_j$ ($BL_1$, $BL_2$ ... $BL_m$). There is usually a pair of complementary bit lines for each column, but only one bit line is shown for sake of simplicity. Bit lines BL are coupled to precharge circuitry 14 and to input/output circuits 16. Multiplexers 18, described below, are usually provided between the bit lines BL and the input/output circuits 16.

In operation, all the bit lines BL are precharged to a high value between two access cycles of the memory. During an access cycle, for example a read cycle, one row is selected and the cells of the selected row will discharge the bit lines BL or leave them precharged, depending on the states stored in the cells. The input/output circuitry 16 detects the levels on the bit lines BL and provides the corresponding word. During a write cycle, the bit lines are discharged down to a level causing the change of the corresponding selected cells.

With a pair of complementary bit lines per column, one bit line of each pair is discharged at every access cycle. This precharging and discharging of the bit lines is the most significant contribution to the power consumption of the memory, because there is usually a large number of columns.

If each row corresponded to one word, the memory would have a shape which would most of the time be inadequate for integration. For example, a 4-Kbit memory of 16-bit words would be 256 times longer than wide. Therefore, each row of memory cells generally contains several words, so that the shape of the memory is more compact and close to a square.

In the structure of FIG. 1, all the words of one row are selected at the same time by a single word line $WL_i$. The multiplexers 18 are provided to select the appropriate bit lines BL for the input/output circuits 16. In the example shown, for two-word rows, each multiplexer 18 selects one or the other of two consecutive bit lines and couples the selected bit line to one input/output circuit 16.

More generally, if each row contains w b-bit words, the words are interlaced so that w consecutive memory cells of the row respectively correspond to the w words. There will be b multiplexers 18 associated to b input/output circuits 16, and each multiplexer receives the bit lines from w consecutive columns. This shortens the connections between the bit lines and the input/output circuits, whereby charge and discharge power is reduced and less area is used.

In the memory structure of FIG. 1, all the bit lines are likely to be discharged, even those which are not selected by the multiplexers 18, causing useless power consumption. In order to reduce the power consumption, it is usual to split up the rows in several subrows which are individually selectable. Then, only the subrow containing the word to be accessed is selected, whereby only the bit lines associated to the selected subrow are discharged. With this technique, the number of word selection lines is multiplied by the number of subrows in a row, whereby the area of the memory is likely to increase.

FIG. 2 illustrates a conventional area efficient solution used for splitting each row into subrows. The matrix is separated in two halves Ma and Mb by the row decoder 12. Each row i is thereby split in two subrows belonging respectively to the two half-matrices Ma and Mb. The word line $WL_i$ associated to each row i is divided in two word lines $WL_{ia}$ and $WL_{ib}$ for separately selecting the two subrows of row i.

In this structure, each multiplexer 18 is separated in two halves, one half for providing a selected bit of half-matrix Ma to a line of an input/output port P and the other half for providing a selected bit of half-matrix Mb to the same line of the input/output port. The necessary interconnections between the half-matrices and the input/output port P represent a substantial area increase as compared to the corresponding interconnections in the single matrix structure of FIG. 1, where each line of the input/output port is coupled to only one multiplexer. The area increase is proportional to the square of the total number of columns in the memory.

Moreover, in order to avoid an unacceptable increase of capacitance of the bit lines, one input/output circuit 16 is provided, as shown, immediately at the output of each half-multiplexer. This doubles the number of input/output circuits as compared to the structure of FIG. 1.

This structure is not adapted to small size memories, especially if the words are large. Indeed, small size memories are usually used as part of a more complex circuit where the main concern is to reduce the silicon area and where the memories are so small that the power they consume is negligible. In practice, the split matrix structure of FIG. 2 is adopted for memory capacities above 64 Kbits.

FIG. 3 illustrates a conventional area efficient solution used for further reducing the number of columns selected at one time. The matrix of memory cells is divided into more than two vertical blocks, for example four blocks Ma to Md. The blocks are contiguous, so that the matrix has continuous rows, each of which is divided in four subrows respectively corresponding to blocks Ma to Md.

The row decoder 12 drives one global word line $GWL_i$ for each row i. The four subrows belonging to row i are separately selectable through respective local word lines $LW_{ia}$ to $LW_{id}$. Each local word line $LW_{ik}$ (k=a, b, c, or d) is coupled to the corresponding global word line $GWL_i$ through a switch transistor 20 and all the switch transistors 20 of block Mk are controlled by the row decoder 12 through a common block selection line $BS_k$.

Like in the split matrix structure of FIG. 2, the input/output port P is shared between the blocks. Therefore, each multiplexer 18 is separated in four quarter-multiplexers respectively associated to the four blocks. Each quarter-multiplexer 18 is immediately followed by an input/output circuit 16 to avoid increasing the capacitance of the bit lines. Thus, this memory structure has four times more input/output circuits 16 than the structure of FIG. 1, in addition to the area-consuming interconnections between the blocks and the input/output port P.

A further area increase is caused by the additional local word lines LW, transistors 20, and block selection lines BS. In practice, the structure of FIG. 3 is adopted for memory capacities above 256 Kbits.

Presently, an optimized design of a memory is complex because one of three different sets of rules is used, depending on the size of the memory. In particular, a complete software tool for designing memories of any size is complex because it must integrate design rules for each of the three above memory structures.

SUMMARY OF THE INVENTION

An object of the invention is to provide a multi-block memory structure which is area efficient even when used for small-size memories.

Another object of the invention is to provide such a memory structure which is particularly well adapted to software for designing memories of variable size.

These objects are achieved, according to the invention, by a memory comprising memory cells arranged in continuous rows which are divided in at least two subrows separately selectable by a row decoder through respective word selection metallizations. Each word selection metallization extends over the row containing the corresponding subrow and the subrows of each row are interlaced.

According to an embodiment of the invention, each memory cell has a local selection line which crosses the word selection metallizations extending over the memory cell but only connects to one corresponding word selection metallization.

According to an embodiment of the invention, consecutive memory cells in a row belong to different subrows of the row.

According to an embodiment of the invention, the memory cells of each subrow are arranged by pairs of cells which share a local selection metallization.

According to an embodiment of the invention, consecutive pairs of memory cells in a row belong to different subrows of the row.

According to an embodiment of the invention, the memory is realized in an integration technology with three metal layers or more.

The foregoing and other objects, features, aspects and advantages of the invention will become apparent from the following detailed description of embodiments, given by way of illustration and not of limitation with reference to the accompanying drawings.

For sake of simplicity, only the elements which are necessary for understanding the invention have been shown. Elements not shown are those of any known memory structure.

DESCRIPTION OF THE PREFERRED EMBODIMENTS

Figure 1:
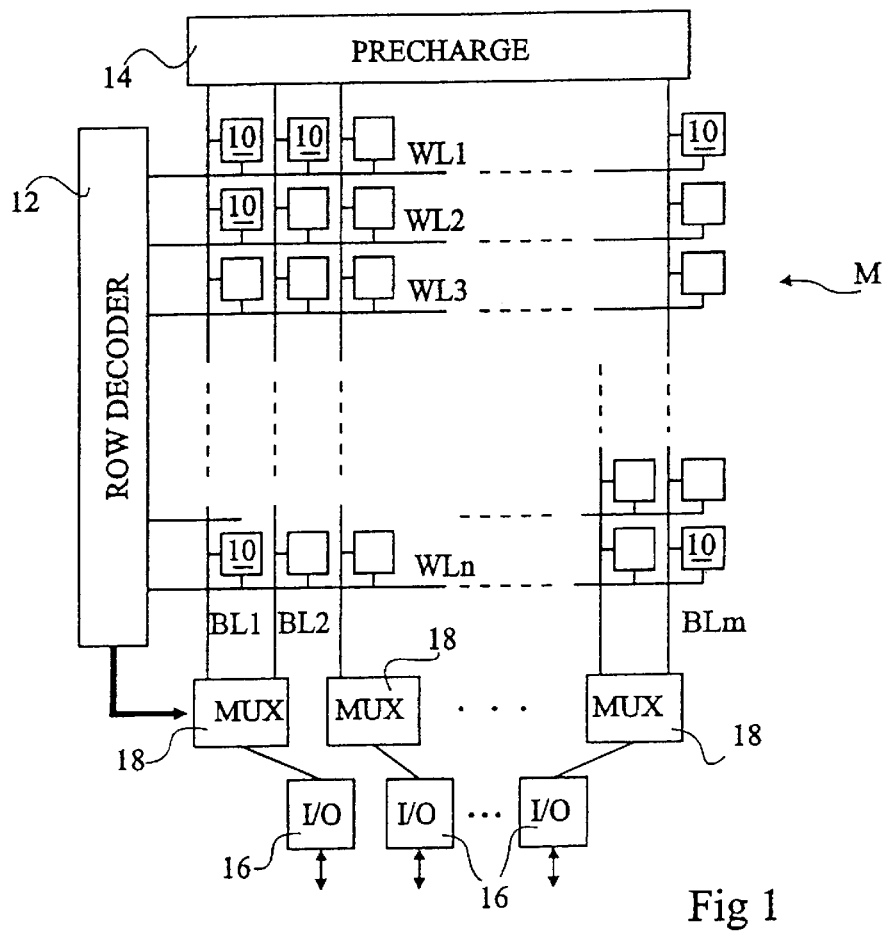
FIGS. 1–3 are intended to illustrate the state of the art and the related problems.
Figure 3:
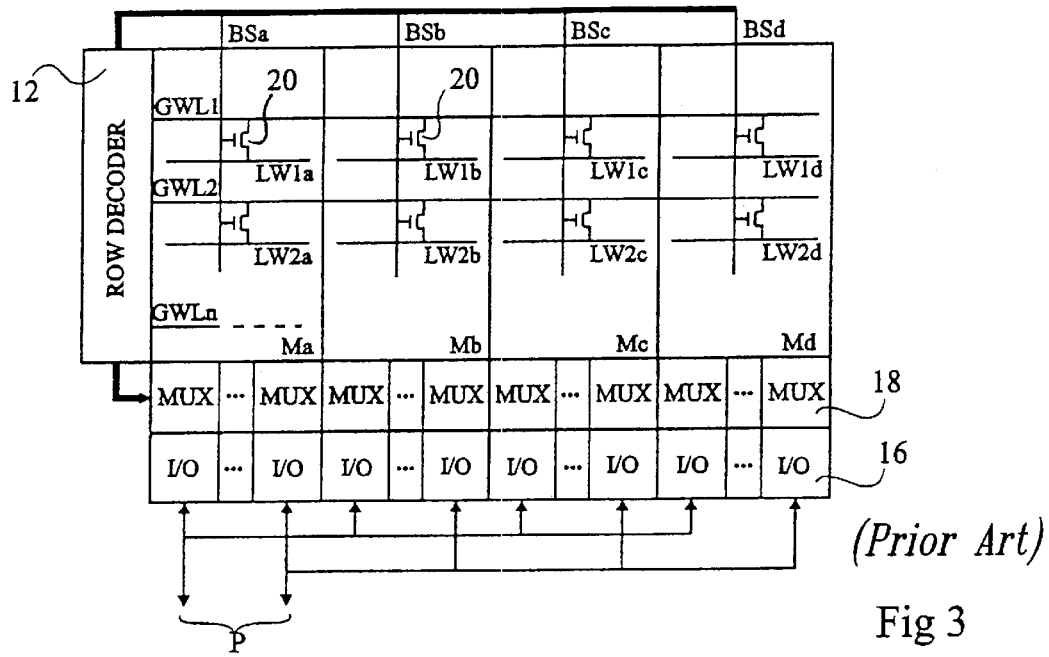

In a memory structure according to the invention, the rows of memory cells 10 are continuous, i.e., they are arranged in a single matrix like in the structures of FIGS. 1 and 3. Each row is divided in subrows which are individually selectable by respective word line metallizations WL. The word line metallizations WL are directly driven by the row decoder 12.

According to the invention, the word line metallizations WL run over the memory cells 10 and are connected in an interlaced manner to the cells of a row so as to form interlaced subrows. In other words, consecutive cells (or groups of cells) of a row belong to respective different subrows. Furthermore, the words of each row are interlaced conventionally, like in the structure of FIG. 1, such that consecutive cells of the row belong to respective different words.

In this manner, it is possible to group together all the bits of same weight of all the words of a row. As will be shown in an example below, the multiplexers 18 and input/output circuits 16 may then be connected like in the structure of FIG. 1, where a minimum area is used by the input/output circuits and by the interconnections between the matrix and the input/output port.

The creation of the word line metallizations over the memory cells is made possible by using recent technologies which provide three or more metal layers. As a result, the area of the matrix does not increase as compared to the single matrix structure of FIG. 1. Only a slight area increase of the whole memory structure is caused by the row decoder 12 which drives more word lines WL as compared to the structure of FIG. 1.

Figure 4A:
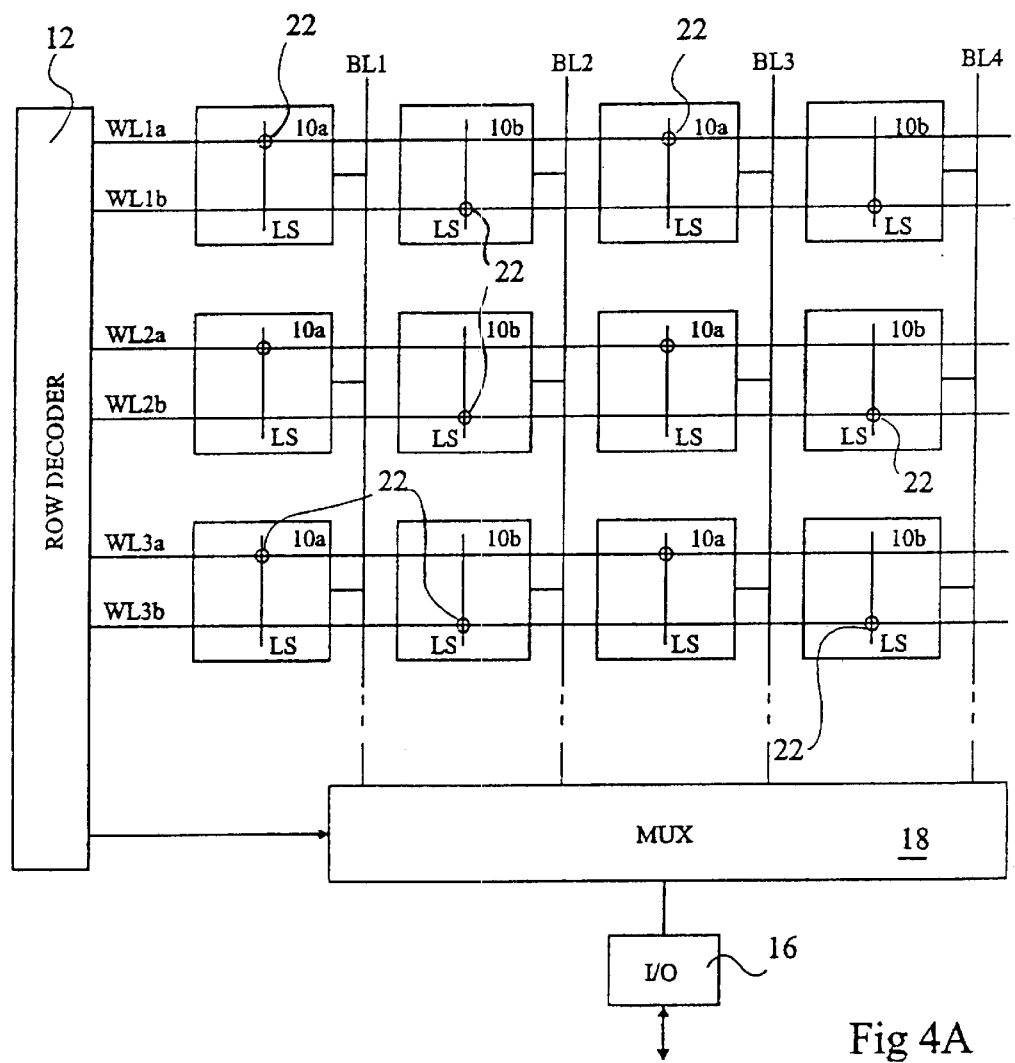
FIG. 4A schematically shows an embodiment of a memory structure according to the invention, wherein each row of memory cells contains two subrows.

FIG. 4A shows an embodiment of a memory structure according to the invention, wherein each row of memory cells 10 is divided in two subrows. The subrows are interlaced, for example, such that each odd memory cell 10a belongs to the first of the two subrows and each even memory cell 10b belongs to the second subrow.

Each row contains, for example, four words. Several consecutive multiplexers 18 (only a first one is shown) receive, each, the bit lines BL of four consecutive columns. There are as many multiplexers 18 as bits in a word, and each multiplexer 18 is associated to a respective input/output circuit 16. The four inputs of each multiplexer 18 correspond to bits of same weight of the four words. Such an arrangement of the multiplexers is similar to that used in the conventional structure of FIG. 1.

The two subrows of each row i are separately selectable through respective word line metallizations $WL_{ia}$ and $WL_{ib}$ which run over the row. Each memory cell 10 (10a or 10b) of a row i preferably has a respective local selection line LS which crosses the word line metallizations WLia and WLib. A via 22 is provided for electrically connecting the local selection line LS and the corresponding word line metallization $WL_{ia}$ or $WL_{ib}$.

Figure 4B:
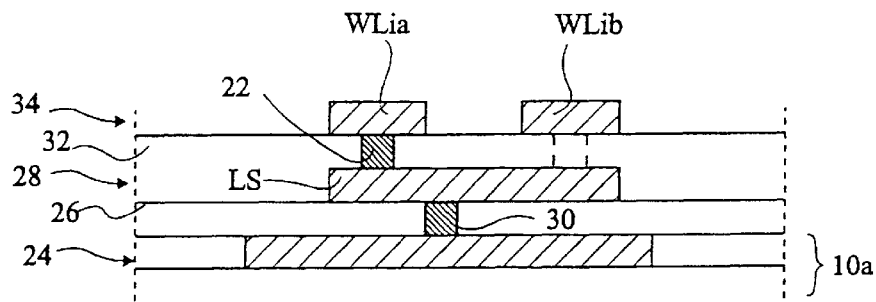
FIG. 4B is a partial cross-section view of the structure of FIG. 4A.

FIG. 4B shows an example of a memory cell 10a in cross-section along its local selection line LS. The elements of the memory cell 10a are realized at the bottom of the circuit and are interconnected through metallizations of a first metal layer 24, for example. This first metal layer 24 is covered by an insulating layer 26 which carries a second metal layer 28.

The local selection line LS is, for example, a metallization realized in the second metal layer 28 and is connected to appropriate metallizations of the first layer 24 through a via 30. More specifically, the via 30 is connected to selection circuitry, not shown, internal to the memory cell, such as the gate of a pass transistor which couples the memory cell to a bit line (not shown). The local selection line LS could also be a polycrystalline silicon area contacted by via 22.

The metal layer 28 is covered by an insulating layer 32 which carries a third metal layer 34. The word line metallizations $WL_{ia}$ and $WL_{ib}$ are realized in this third metal layer 34 and the corresponding one, here $WL_{ia}$, is connected to local selection line LS through via 22. Dotted lines illustrate the location of a via 22 which would connect word line metallization $WL_{ib}$ to the local selection line LS in a memory cell 10b.

An advantage of the transverse local selection lines LS is to allow the use of a same elementary structure for the memory cells and their interconnections. The subrows of each row are defined by positioning the vias 22 in a last simple masking step.

Figure 5:
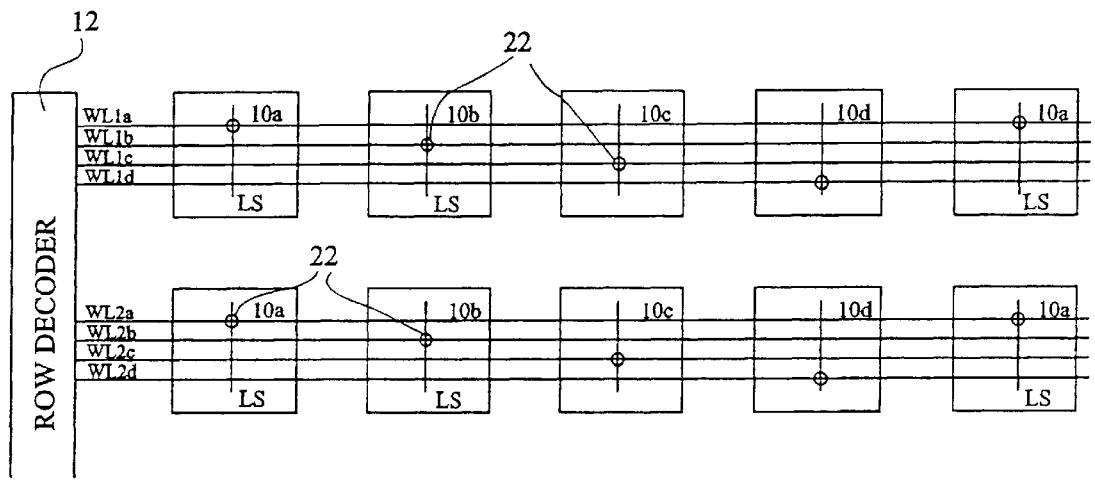
FIG. 5 schematically shows an embodiment of a memory structure according to the invention, wherein each row of memory cells contains four subrows.

FIG. 5 shows an embodiment of a memory structure according to the invention, wherein each row of memory cells 10 is divided in four subrows. In this embodiment, the subrows are shown interlaced such that four consecutive memory cells 10a to 10d in a row belong respectively to the four subrows.

The four subrows of each row i are separately selectable through respective word line metallizations $WL_{ia}$ to $WL_{id}$ which run over the row. Like in FIG. 4, each memory cell 10 (10a to 10d) has a local selection line LS which crosses the word line metallizations $WL_{ia}$ to $WL_{id}$ running over the memory cell. A via 22 is provided between each local selection line LS and the corresponding word line metallization $WL_{ia}$, $WL_{ib}$, $WL_{ic}$ or $WL_{id}$.

With future technologies, the width of the metallizations will decrease, whereby an increasing number of word line metallizations WL will fit across each row.

Figure 6:
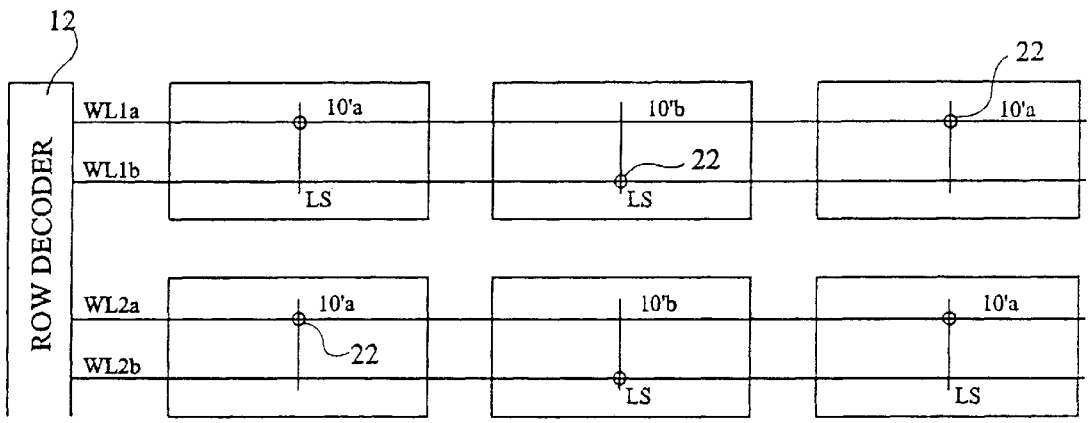
FIG. 6 schematically shows an alternative embodiment of a memory structure according to the invention, wherein each row of memory cells contains two subrows.

FIG. 6 shows an embodiment of a memory structure according to the invention, similar to that of FIG. 4A, but wherein the memory cells of each row are arranged by pairs 10' of memory cells. The two memory cells of each pair 10' share one local selection line LS. In this embodiment, the subrows are shown interlaced such that each odd pair 10'a belongs to a first subrow and each even pair 10'b belongs to a second subrow.

In the embodiments of FIGS. 5 and 6, the multiplexers and input/output circuits, not shown, are connected as explained in relation with FIG. 1 or 4A.

An advantage of a memory structure according to the invention is that its design is simplified by the regularity of the structure. This is particularly useful for software design tools, such as a RAM generator. Moreover, since a memory structure according to the invention can be used advantageously for any memory size, a single memory design technique may be used regardless of the size.

Figure 2:
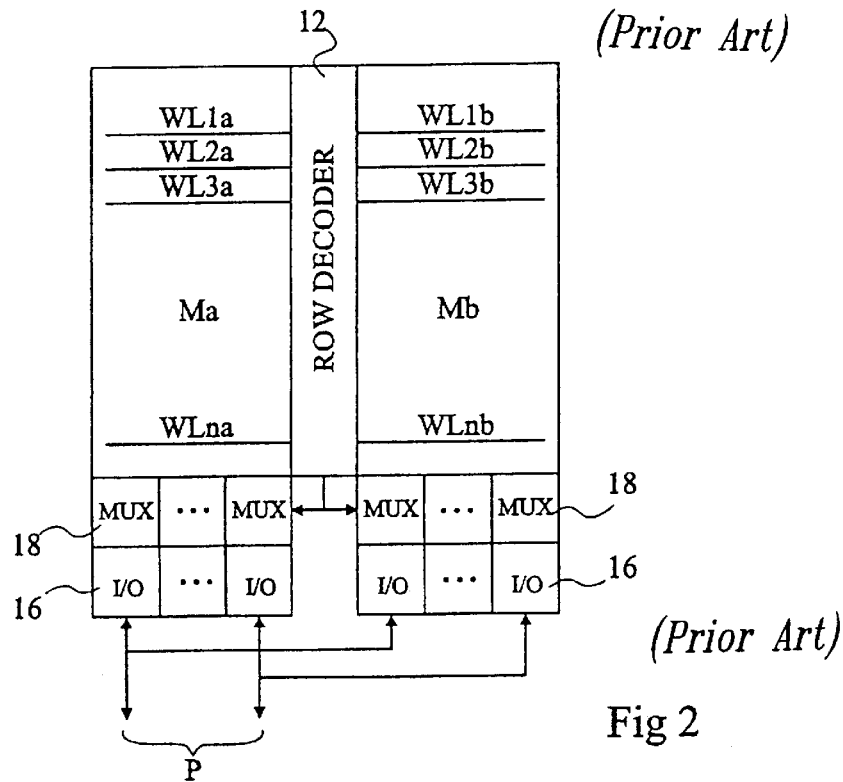

Many alternatives and modifications of the present invention will appear to those skilled in the art. For example, the subrows of a row may be interlaced such that more than two consecutive memory cells belong to a same subrow (such as for the embodiment of FIG. 6). The only constraint is that the bits of each word must be within a same subrow. The invention may be combined with other multi-block structures, such as the split matrix structure of FIG. 2.

Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A memory comprising memory cells arranged in continuous rows which are divided into two subrows separately selectable by a row decoder through respective word selection metallizations wherein each word selection metallization extends over the memory cells of both subrows of the row containing the corresponding subrow and the subrows of each row are interlaced, wherein each memory cell has a local selection line which crosses the word selection metallizations extending over the memory cell but connects directly to only one of the word selection metallizations.

2. The memory according to claim 1 wherein consecutive memory cells in a row belong to different subrows of the row.

3. The memory according to claim 1 wherein the memory cells of each row are arranged by pairs of cells and wherein each pair uses a common contact to couple to a respective one of the local selection lines.

4. The memory according to claim 3 wherein consecutive pairs of memory cells in a row belong to different subrows of the row.

5. The memory according to claim 1 wherein the memory is realized in an integration technology with three metal layers or more.

6. An integrated circuit, comprising:

a plurality of memory cells for storing data arranged in an array of rows and columns, each row being a straight linear arrangement of all of the memory cells of the row;

a plurality of word lines for each row, the word lines being isolated from each other and extending across a plurality of memory cells in a respective row, a first one of the word lines being electrically coupled to a first group of the memory cells in a first one of the rows and extending across without being electrically coupled to the memory cells of a second group of the memory cells in the first row; and a plurality of local selection lines respectively coupled to the plurality of memory cells, each local selection line crossing both of the word lines for the row of the memory cell to which the local selection line is coupled.

7. The integrated circuit of claim 6 wherein the word line coupled to one of the cells in one row is not coupled to either of the adjacent cells in the same row.

8. The integrated circuit of claim 6 wherein at least one of the word lines extends across every memory cell in the respective row.

9. The integrated circuit of claim 6 wherein a second word line is electrically coupled to the memory cells of the second group and extends across without being electrically coupled to the memory cells of the first group, the second group of memory cells being mutually exclusive of the memory cells of the first group of memory cells.

10. The integrated circuit of claim 9 wherein the first group of memory cells and the second group of memory cells together comprise every memory cell in the first row.

11. An integrated circuit, comprising:

a plurality of memory cells arranged in a row;

a plurality of local selection lines respectively coupled to each memory cell in the row, each local selection line extending across at least a portion of the memory cell to which it is coupled;

a first word line electrically coupled to a first memory cell in the row via the respective local selection line, and extending across without being electrically coupled to at least one of the other memory cells and its respective local selection line, the first word line extending approximately the length of the row to overlay a plurality of memory cells in the row; and a second word line electrically coupled to a second memory cell in the row, via the respective local selection line, to which the first word line is not coupled, the second memory cell being in the row as and spaced from the first memory cell, the second word line extending across all of the memory cells of the row and overlaying each local selection line.

12. The integrated circuit of claim 11 wherein the first word line extends the entire length of the row.

13. The integrated circuit of claim 11 wherein each local selection line extends in a direction approximately perpendicular to the word line to which the local selection line is coupled.

14. The integrated circuit of claim 11 wherein each local selection line extends across the first and second word lines.

* * * * *